(12) United States Patent
Ching et al.

(10) Patent No.: US 10,361,280 B2
(45) Date of Patent: Jul. 23, 2019

(54) GATE STRUCTURE FOR SEMICONDUCTOR DEVICE

(71) Applicant: Taiwan Semiconductor Manufacturing Co., Ltd., Hsinchu (TW)

(72) Inventors: Kuo-Cheng Ching, Hsinchu County (TW); Chih-Hao Wang, Hsinchu County (TW); Ching-Wei Tsai, Hsinchu (TW); Kuan-Lun Cheng, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/857,196

(22) Filed: Dec. 28, 2017

(65) Prior Publication Data

US 2019/0067448 A1  Feb. 28, 2019

Related U.S. Application Data

(60) Provisional application No. 62/552,245, filed on Aug. 30, 2017.

(51) Int. Cl.
*H01L 29/66* (2006.01)
*H01L 29/78* (2006.01)
(Continued)

(52) U.S. Cl.
CPC .. *H01L 29/66545* (2013.01); *H01L 21/02532* (2013.01); *H01L 21/02595* (2013.01);
(Continued)

(58) Field of Classification Search
CPC ......... H01L 29/66545; H01L 29/66871; H01L 29/7856
See application file for complete search history.

(56) References Cited

U.S. PATENT DOCUMENTS 6,204,130 B1 *   3/2001  Gardner ............ H01L 21/28123
                                                       257/E21.206
8,916,475 B1 * 12/2014  Chen ................... H01L 21/3085
                                                       438/700
(Continued)

FOREIGN PATENT DOCUMENTS

TW    201401520 A    1/2014
TW    201643967 A   12/2016
TW    201724280 A    7/2017

*Primary Examiner* — Matthew L Reames
*Assistant Examiner* — John A Bodnar
(74) *Attorney, Agent, or Firm* — Sterne, Kessler, Goldstein & Fox P.L.L.C.

(57) ABSTRACT

A method of forming a fin field effect transistors (finFET) on a substrate includes forming a fin structure on the substrate, forming a protective layer on the fin structure, and forming a polysilicon structure on the protective layer. The method further includes modifying the polysilicon structure such that a first horizontal dimension of a first portion of the modified polysilicon structure is smaller than a second horizontal dimension of a second portion of the modified polysilicon structure. The method further includes replacing the modified polysilicon structure with a gate structure having a first horizontal dimension of a first portion of the gate structure that is smaller than a second horizontal dimension of a second portion of the gate structure.

20 Claims, 9 Drawing Sheets

(51) Int. Cl.
*H01L 21/02* (2006.01)
*H01L 21/3065* (2006.01)
*H01L 29/45* (2006.01)
*H01L 21/28* (2006.01)
*H01L 29/423* (2006.01)

(52) U.S. Cl.
CPC .... *H01L 21/28114* (2013.01); *H01L 21/3065* (2013.01); *H01L 29/42376* (2013.01); *H01L 29/456* (2013.01); *H01L 29/66795* (2013.01); *H01L 29/7851* (2013.01)

(56) References Cited

U.S. PATENT DOCUMENTS

| | | | |
|---|---|---|---|
| 9,627,379 B1* | 4/2017 | Chang | H01L 27/0886 |
| 9,704,969 B1 | 7/2017 | Chang et al. | |
| 2015/0171216 A1* | 6/2015 | Xie | H01L 27/1211 |
| 2015/0214244 A1* | 7/2015 | Ho | H01L 27/1203 257/506 |
| 2015/0357427 A1 | 12/2015 | Kim et al. | |
| 2016/0359043 A1 | 12/2016 | Chen et al. | |
| 2017/0053913 A1* | 2/2017 | Min | H01L 29/7843 |

\* cited by examiner

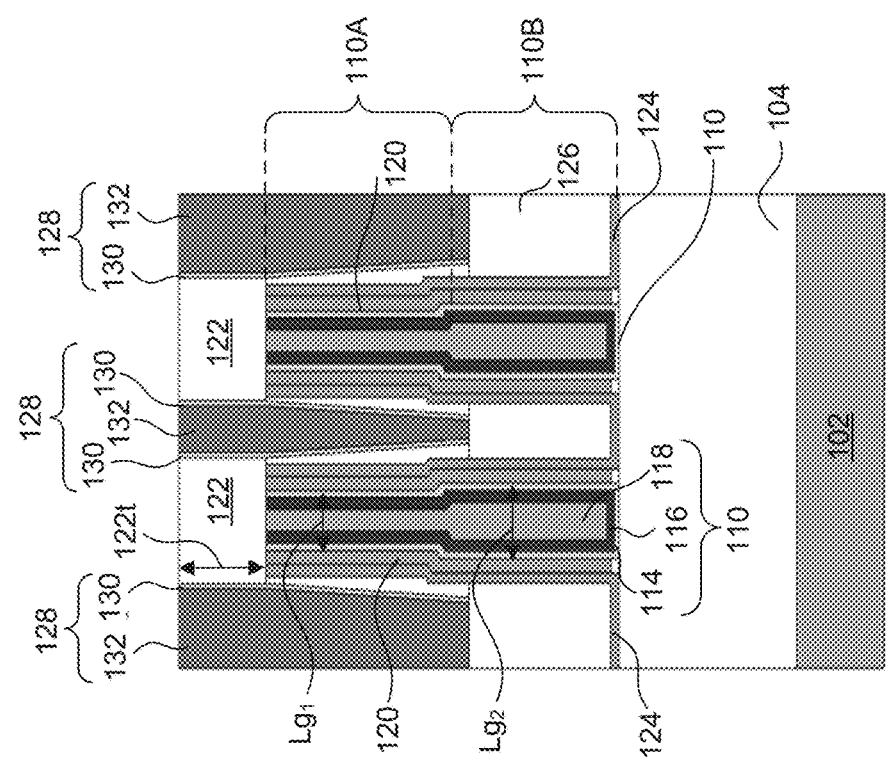
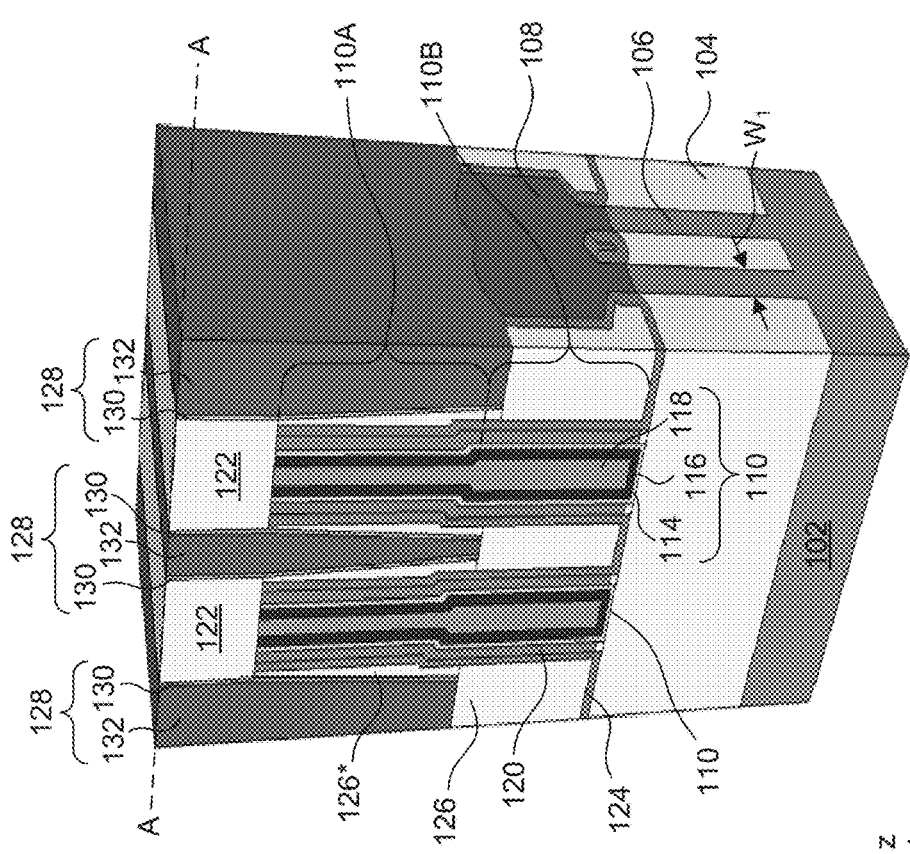
FIG. 1A
FIG. 1B

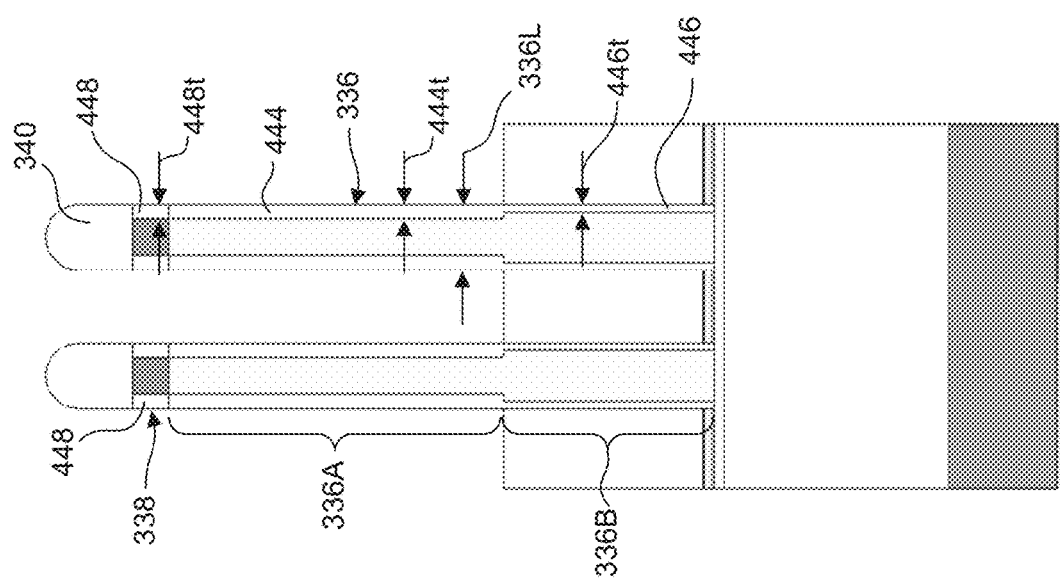
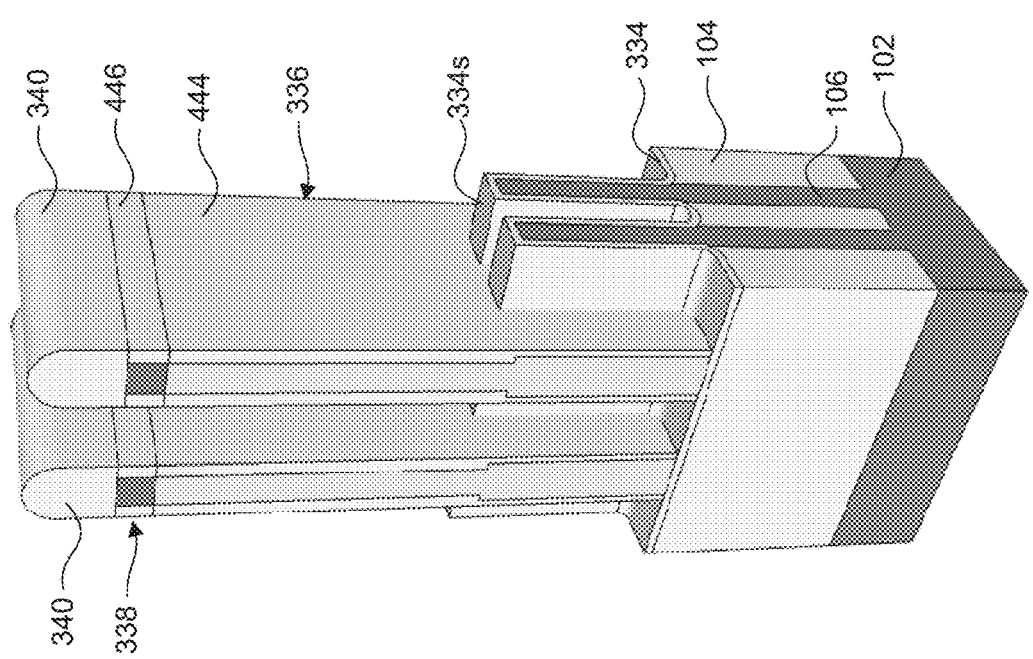
FIG. 4B
FIG. 4A

GATE STRUCTURE FOR SEMICONDUCTOR DEVICE

This application claims the benefit of U.S. Provisional Patent Application No. 62/552,245, titled "Gate Structure for Semiconductor Device," which was filed on Aug. 30, 2017 and is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1A-1B are isometric views of a fin field effect transistor (finFETs), in accordance with some embodiments.

FIGS. 3A-9A are isometric views of a finFET at various stages of its fabrication process, in accordance with some embodiments.

FIGS. 3B-9B are cross-sectional views of a finFET at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 2:
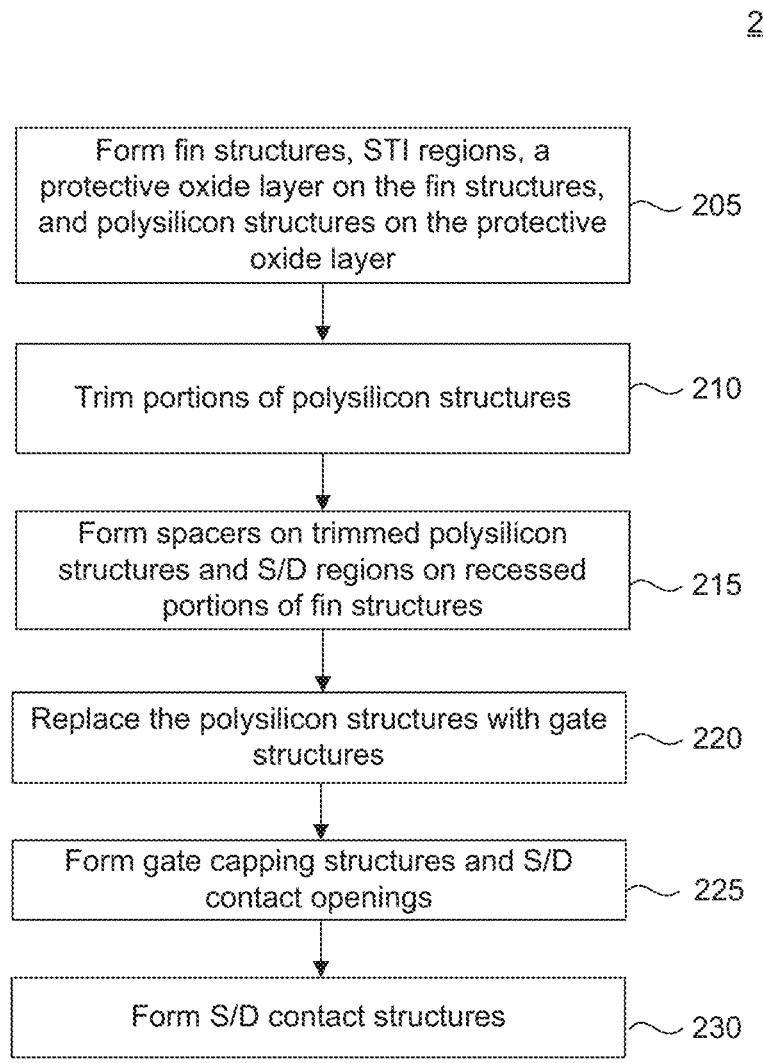
FIG. 2 is a flow diagram of a method for fabricating a finFET, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins of fin field effect transistors (finFETs) may be patterned by any suitable method. For example, the fins may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "substantially" indicates that the value of a given quantity varies by ±1% to ±5% of the value.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical" means nominally perpendicular to the surface of a substrate.

As used herein, the term "critical dimension" refers to the smallest feature size (e.g., line width) of a finFET and/or an element of an integrated circuit.

This disclosure provides example structures and methods for enlarging contact openings (e.g., S/D contact openings) for forming contact structures (e.g., S/D contact structures) of finFETs and minimizing short channel effects in the finFETs.

FIG. 1A is an isometric view of a finFET 100 and FIG. 1B is a cross-sectional view along line A-A of finFET 100 of FIG. 1A, according to some embodiments. FinFET 100 is described below with reference to FIGS. 1A and 1B. FinFET 100 may be included in a microprocessor, memory cell, or other integrated circuit. It will be recognized that the views of finFET 100 in FIGS. 1A and 1B are shown for illustration purposes and may not be drawn to scale.

FinFET 100 is formed on a substrate 102 and can include shallow trench isolation (STI) regions 104, fin structures 106, source/drain (S/D) regions 108, gate structures 110, spacers 120 disposed on opposite sides of gate structures 110, gate capping structures 122, an etch stop layer (ESL) 124, an interlayer dielectric (ILD) layer 126, and S/D contact structures 128. It will be understood that even though FIG. 1A shows one of S/D regions 108 under one of S/D contact structures 128, other S/D regions 108 are under the other S/D contact structures 128.

In some embodiments, finFET 100 can be a multi-fin finFET having a plurality of fin structures 106, or finFET 100 can be a single-fin finFET having one of fin structures 106. In some embodiments, a multi-fin finFET such as, for example, finFET 100 is used for high current drive devices (e.g., current sources) because of the multi-fin finFET's larger effective channel width compared to a single-fin finFET. In some embodiments, single-fin finFETs (not shown) can be used for high density devices (e.g., high density memory devices) because of their smaller device area compared to multi-fin finFETs such as, for example, finFET 100.

Substrate 102 is a physical material on which finFET 100 is formed. Substrate 102 can be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 may be doped depending on design requirements (e.g., p-type substrate or n-type substrate). In some embodiments, substrate 102 may be doped with p-type dopants (e.g., boron, indium, aluminum, or gallium) or n-type dopants (e.g., phosphorus or arsenic).

STI regions 104 provide electrical isolation to finFET 100 from neighboring active and passive elements (not illustrated herein) integrated with or deposited onto substrate 102. STI regions 104 is made of a dielectric material. In some embodiments, STI regions 104 can include silicon oxide, silicon nitride, silicon oxynitride, fluorine-doped silicate glass (FSG), a low-k dielectric material, and/or other suitable insulating material. In some embodiments, STI regions 104 can include a multi-layered structure.

Fin structures 106 may traverse along an X-axis and through gate structures 110. Fin structures 106 each includes fin regions underlying gate structures 110. Fin regions of fin structures 106 can extend above STI regions 104 and can be wrapped around by gate structures 110. In some embodiments, fin structures 106 include material similar to substrate 102. In some embodiments, fin structures 106 are formed from a photolithographic patterning and an etching of substrate 102. Fin structures 106 can have respective widths $W_1$ in a range from about 5 nm to about 10 nm, according to some embodiments. Based on the disclosure herein, it will be recognized that other widths and materials for fin structures 106 are within the scope and spirit of this disclosure.

In some embodiments, S/D regions 108 can be a merged region and include epitaxially-grown semiconductor material. In some embodiments, the epitaxially-grown semiconductor material is the same material as the material of substrate 102. In some embodiments, the epitaxially-grown semiconductor material includes a different material from the material of substrate 102. The epitaxially-grown semiconductor material can include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. Other materials for S/D regions 108 are within the scope and spirit of this disclosure.

In some embodiments, S/D regions 108 can be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or a suitable CVD; (ii) molecular beam epitaxy (MBE) processes; (iii) a suitable epitaxial process, or (iv) a combination thereof. In some embodiments, S/D regions 108 is grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 108 is grown by selective epitaxial growth (SEG), where an etching gas is added to promote the selective growth of semiconductor material on the exposed surfaces of fin structures, but not on insulating material (e.g., dielectric material of STI regions 104). Other methods for epitaxially growing S/D regions 108 are within the scope and spirit of this disclosure.

In some embodiments, S/D regions 108 can be p-type regions or n-type regions. In some embodiments, p-type S/D regions 108 can include SiGe and is in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type S S/D regions 108 can include Si and is in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used. In some embodiments, S/D regions 108 are not in-situ doped, and an ion implantation process is performed to dope S/D regions 108.

Each of gate structures 110 includes a dielectric layer 116 and a gate electrode 118. Additionally, in some embodiments, gate structure 110 can include an oxide layer 114. In some embodiments, oxide layer 114 may be absent. In some embodiments, gate structure 110 is formed by a gate replacement process.

Each of gate structures 110 has first and second gate portions 110A and 110B. Gate portions 110A are portions of gate structures 110 that extend above top surfaces of the fin regions (not shown). Fin regions are portions of fin structures 106 underlying gate structures 110. Gate portions 110B are portions of gate structures 110 that are below the top surfaces of the fin regions. Gate portions 110A and 110B have respective first and second horizontal dimensions along X-axis (e.g., gate lengths) $Lg_1$ and $Lg_2$ (shown in FIG. 1B). In some embodiments, gate length $Lg_2$ can be greater than gate length $Lg_1$ by a value ranging from about 1 nm to about 4 nm. In some embodiments, gate length $Lg_1$ can range from about 8 nm to about 12 nm and gate length $Lg_2$ can range from about 9 nm to about 16 nm.

Varying gate lengths of each gate structures 110 along Z-axis can help enlarge the window for forming S/D contact structures 128 and minimizing short channel effects of finFET 100. Gate portions 110A can be formed with gate length $Lg_1$ as needed to enlarge the window for the formation of S/D contact structures 128 without damaging gate structures 110 and/or shorting S/D contact structures 128 with gate structures 110. Whereas, gate portions 110B can be formed with gate length $Lg_2$ as needed to minimize short channel effects, and consequently, improve the performance of finFET 100. For example, gate portions 110A can be formed with gate length $Lg_1$ smaller than gate length $Lg_2$ to enlarge the window for S/D contact structures 128 between gate structures 110 and between gate structures 110 and adjacent elements (not shown). And, gate portions 110B can be formed with gate length $Lg_2$ greater than, for example, 12 nm to minimize the short channel effects of finFET 100.

Referring back to FIGS. 1A and 1B, dielectric layer 116 is adjacent to and in contact with gate electrode 118. Dielectric layer 116 can have a thickness in a range of about 1 nm to about 5 nm. Dielectric layer 116 can include silicon oxide and may be formed by CVD, atomic layer deposition (ALD), physical vapor deposition (PVD), e-beam evaporation, or other suitable process. In some embodiments, dielectric layer 116 can include (i) a layer of silicon oxide, silicon nitride, and/or silicon oxynitride. (ii) a high-k dielectric material such as, for example, hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers may be formed by ALD and/or other suitable methods. In some embodiments, dielectric layer 116 includes a single layer or a stack of insulating material layers. Based on the disclosure herein, it will be recognized that other materials and formation methods for dielectric layer 116 are within the scope and spirit of this disclosure.

In some embodiments, oxide layer 114 can be in contact with spacers 120 and formed during a wet clean process after the removal of polysilicon structure during the gate replacement process (described with reference to FIGS. 6A-7A and 6-7B). In some embodiments, oxide layer 114 can have a thickness ranging from about 0.5 nm to about 2 nm.

Gate electrode 118 can include a gate work function metal layer (not shown) and a gate metal fill layer (not shown). In some embodiments, gate work function metal layer is disposed on dielectric layer 116. The gate work function metal layer can include a single metal layer or a stack of metal layers. The stack of metal layers can include metals having work functions similar to or different from each other. In some embodiments, the gate work function metal layer includes, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer can be formed using a suitable process such as ALD, CVD, PVD, plating, or combinations thereof. In some embodiments, the gate work function metal layer has a thickness in a range from about 2 nm to about 15 nm. Based on the disclosure herein, it will be recognized that other materials, formation methods, and thicknesses for the gate work function metal layer are within the scope and spirit of this disclosure.

The gate metal fill layer can include a single metal layer or a stack of metal layers. The stack of metal layers can include metals different from each other. In some embodiments, the gate metal fill layer includes a suitable conductive material such as, for example, Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layer can be formed by ALD, PVD, CVD, or other suitable deposition process. Based on the disclosure herein, it will be recognized that other materials and formation methods for the gate metal fill layer are within the scope and spirit of this disclosure.

Spacers 120 form sidewalls of gate structures 110 and are in contact with oxide layer 114 or in contact with dielectric layer 116 when oxide layer 114 is absent, according to some embodiments. Spacers 120 include insulating material such as, for example, silicon oxide, silicon nitride, a low-k material, or a combination thereof. Spacers 112 can have a low-k material with a dielectric constant less than 3.9 (e.g., less than 3.5, 3, or 2.8). In some embodiments, each of spacers 120 can have a thickness ranging from about 7 nm to about 10 nm. Based on the disclosure herein, it will be recognized that other materials and thicknesses for spacers 120 are within the scope and spirit of this disclosure.

Each of gate capping structures 122 is disposed on respective one of gate structures 110, spacers 120, ESL 124, and/or ILD 126 and is configured to protect these underlying structures and/or layers during subsequent processing of finFET 100. For example, gate capping structures 122 can be configured to act as an etch stop layer during formation of S/D contact structures 128. In some embodiments, each of gate capping structures has a thickness 122t, which can range from about 10 nm to about 70 nm. Gate capping structures 122 can each include one or more layers of insulating material having (i) nitride-based material such as, for example, silicon nitride, silicon-rich nitride, silicon oxynitride, titanium nitride; (ii) carbide-based material such as, for example, silicon carbide, titanium carbide, tungsten carbide, other suitable metal carbides; (iii) an elementary semiconductor such as, for example, silicon; (iv) metal oxide-based material; or (v) a combination thereof. In some embodiments, gate capping structures 122 can each include a stack of layers of insulating material, where each layer of the stack can have a material and dimensions different from each other layers in the stack. The stack of layers can include two or more layers of the insulating material. Other materials and thicknesses for gate capping structures 122 are within the scope and spirit of this disclosure.

ESL 124 can be configured to protect gate structures 110 and/or portions of S/D regions 108 that are not in contact with source/drain (S/D) contact structures 128. This protection can be provided, for example, during formation of ILD layer 126 and/or S/D contact structures 128. ESL 124 is disposed on sides of spacers 120. In some embodiments, ESL 124 includes, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 124 includes silicon nitride or silicon oxide formed by LPCVD, plasma enhanced chemical vapor deposition (PECVD), CVD, or silicon oxide formed by a high-aspect-ratio process (HARP). In some embodiments, ESL 124 can have a thickness in a range from about 3 nm to 10 nm or from about 10 nm to about 30 nm. Based on the disclosure herein, it will be recognized that other materials, formation methods, and thicknesses for ESL 124 are within the scope and spirit of this disclosure.

ILD layer 126 is disposed on ESL 124 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material is silicon oxide. In some embodiments, ILD layer 126 can have a thickness in a range from about 50 nm to about 200 nm. Based on the disclosure herein, it will be recognized that other materials, thicknesses, and formation methods for ILD layer 126 are within the scope and spirit of this disclosure.

S/D contact structures 128 are configured to electrically connect respective S/D regions 108 of finFETs 100 to other elements of finFET 100 and/or of the integrated circuit. S/D contact structures 128 can be formed within ILD layer 126. Each of S/D contact structures 128 can include a metal silicide layer (not shown), a barrier layer 130, and a conductive region 132. The metal silicide layers is at an interface between top surfaces of S/D regions 108 and conductive regions 132. In some embodiments, there are conductive liners (not shown) between metal silicide layers and conductive regions 136. The conductive liners can be configured as diffusion barriers to prevent diffusion of unwanted atoms and/or ions into S/D regions 108 during formation of conductive regions 132. In some embodiments, the conductive liners can include a single layer or a stack of conductive materials such as, for example, TiN, Ti, Ni, TaN, Ta, or a combination thereof. In some embodiments, the conductive liners act as an adhesion-promoting-layer, a glue-layer, a primer-layer, a protective-layer, and/or a nucleation-layer. The conductive liners can have a thickness in a range from about 1 nm to about 2 nm, according to some embodiments.

In some embodiments, the metal silicide layers can include metal silicides and provide a low resistance interface between respective conductive regions 132 and corresponding S/D regions 108. Examples of metal used for forming the metal silicides are Co, Ti, or Ni.

In some embodiments, barrier layer 130 is deposited along sidewalls of etched ILD layer 126* and gate capping structures 122. Etched ILD layer 126* can formed from etching portions of ILD layer 126 on S/D regions 108. Barrier layer 130 can be on sidewalls of conductive regions 132 and not on bottom surface of conductive regions 132. In some embodiments, barrier layer 130 may not be in contact with top surfaces of S/D regions 108. Barrier layer 130 can include nitride or oxide materials and provide additional barrier against electrical shorting of S/D contact structures 128 with gate structures 110.

In some embodiments, conductive regions 132 include conductive materials such as, for example, W, Al, or Co. In some embodiments, conductive regions 132 can each have an average horizontal dimension (e.g., width) in a range from about 15 nm to about 25 nm and can each have an average vertical dimension (e.g., height) in a range from about 400 nm to about 600 nm. Based on the disclosure herein, it will be recognized that other materials and dimensions for conductive liners, metal silicide layers, barrier layers 130, and conducive regions 132 are within the scope and spirit of this disclosure.

FIGS. 1A-1B show two gate structures 110. However, based on the disclosure herein, it will be recognized that finFET 100 can have additional gate structures similar and/or parallel to gate structure 110. In addition, finFET 100 can be incorporated into an integrated circuit through the use of other structural components such as gate contact structures, conductive vias, conductive lines, dielectric layers, passivation layers, etc., that are omitted for the sake of simplicity. Based on the disclosure herein, it will be recognized that cross-sectional shapes of STI regions 104, fin structures 106, S/D regions 108, gate structures 110, spacers 120, ESL 124, ILD layer 126, and S/D contact structures 128 are illustrative and are not intended to be limiting.

FIG. 2 is a flow diagram of an example method 200 for fabricating finFET 100, according to some embodiments. For illustrative purposes, the operations illustrated in FIG. 2 will be described with reference to the example fabrication process for fabricating finFET as illustrated in FIGS. 3A-9A and 3B-9B. FIGS. 3A-9A are isometric views of finFET 100 at various stages of fabrication, and FIGS. 3B-9B are cross-sectional views along lines A-A of respective structures of FIGS. 3A-9A, according to some embodiments. Operations can be performed in a different order or not performed depending on specific applications. It should be noted that method 200 does not produce a complete finFET 100. Accordingly, it is understood that additional processes may be provided before, during, and after method 200, and that some other processes may only be briefly described herein. Elements in FIGS. 3A-9A and 3B-9B with the same annotations as elements in FIGS. 1A-1B are described above.

Figure 3B:
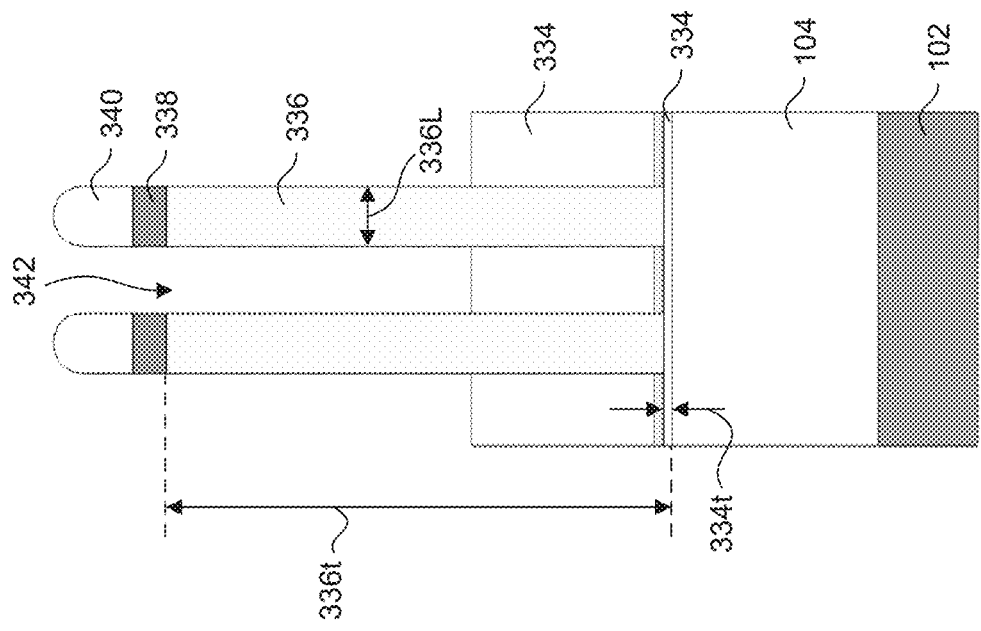
Figure 3A:
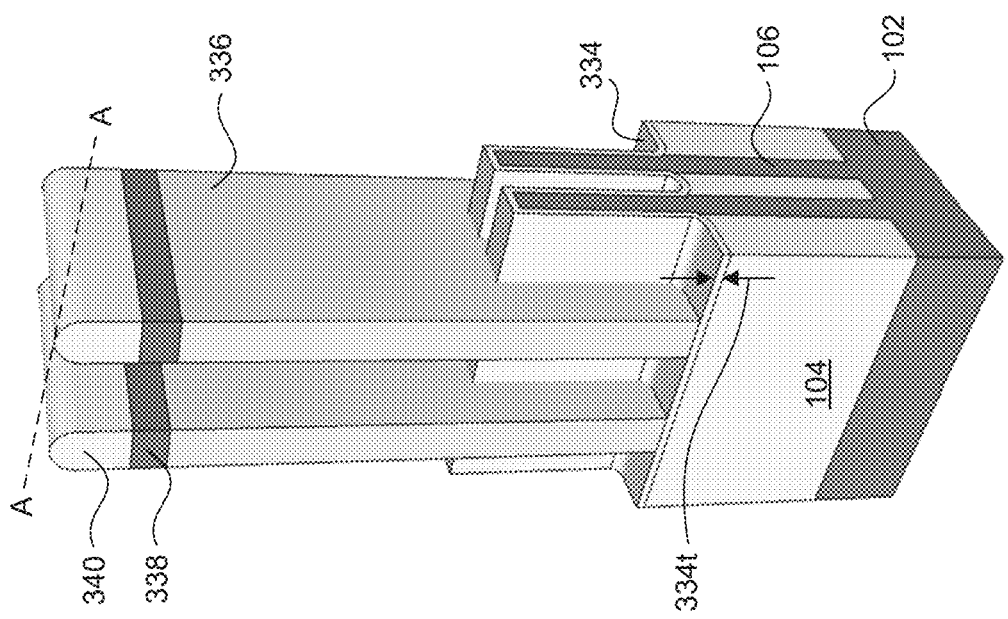

In operation 205, fin structures and STI regions are formed on a substrate, a protective oxide layer is formed on the fin structures, and polysilicon structures are formed on the protective oxide layer. For example, as shown in FIGS. 3A and 3B, fin structures 106 and STI regions 104 are formed on substrate 102, a protective oxide layer 334 is formed on fin structures 106, and polysilicon structures 336 are formed on protective oxide layer 334. Fin structures 106 can be formed by etching substrate 102 through patterned hard mask layer (not shown) formed on unetched substrate 102. In some embodiments, one or more layers of the hard mask layer is a thin film including silicon oxide formed, for example, using a thermal oxidation process. In some embodiments, one or more layers of the hard mask layer is formed of silicon nitride using, for example, CVD, LPCVD, PECVD, other suitable processes, and/or combinations thereof. In some embodiments, fin structures 106 each may have fin widths W less than about 30 nm.

The formation of fin structures 106 is followed by the formation of STI regions 104 that can include depositing a layer of insulating material on fin structures 106, a chemical mechanical polishing (CMP) process, and an etching process. The CMP process can remove the patterned hard mask layers and portions of the layer of the insulating material to substantially coplanarize a top surface of the layer of insulating material with top surfaces of fin structures 106. The CMP process can be followed by the etching process to etch back the layer of insulating material.

The etch back of the layer of insulating material is performed, for example, by a dry etch process, a wet etch process, and/or combinations thereof. In some embodiments, the dry etch process includes a plasma dry etch process with a gas mixture having octafluorocyclobutane ($C_4F_8$), argon (Ar), oxygen ($O_2$), helium (He), fluoroform ($CHF_3$) and He, carbon tetrafluoride ($CF_4$), difluoromethane ($CH_2F_2$), chlorine ($Cl_2$), hydrogen bromide (HBr), and/or combinations thereof. In some embodiments, the dry etch process can be performed with a pressure ranging from about 1 mTorr to about 5 mTorr. In some embodiments, the etch process may be performed at a pressure ranging from about 5 mTorr to about 100 mTorr (e.g., about 20 mTorr, about 30 mTorr, or about 40 mTorr) and a temperature ranging from about 50° C. to about 120° C. In some embodiments, the wet etch process can include a diluted hydrofluoric acid (DHF) treatment, an ammonium peroxide mixture (APM), a sulfuric peroxide mixture (SPM), hot deionized water (DI water), and/or combinations thereof. In some embodiments, the wet etch process includes an etch process that uses ammonia ($NH_3$), hydrofluoric acid (HF), other etchants, and/or combinations thereof.

In some embodiments, the layer of insulating material includes, for example, silicon oxide, silicon nitride, silicon oxynitride, fluoride-doped silicate glass (FSG), or a low-k dielectric material. In some embodiments, layer of insulating material 108* can be deposited using a flowable chemical vapor deposition (FCVD) process, a high-density-plasma (HDP) CVD process, using silane ($SiH_4$) and oxygen ($O_2$) as reacting precursors. In some embodiments, layer of insulating material 108* is formed using a sub-atmospheric CVD (SACVD) process or high aspect-ratio process (HARP), where process gases may include tetraethoxysilane (TEOS) and/or ozone ($O_3$). In some embodiments, the layer of insulating material is formed using a spin-on-dielectric (SOD) such as, for example, hydrogen silsesquioxane (HSQ) or methyl silsesquioxane (MSQ).

The formation of STI regions 104 can be followed by the deposition of protective oxide layer 334. The material of protective oxide layer 334 is blanket deposited on fin structures 106 and STI regions 104 as shown in FIGS. 3A and 3B. Protective oxide layer 334 can include a suitable oxide material, such as, for example, silicon oxide and deposited using a suitable deposition process, such as, for example, CVD or ALD. In some embodiments, protective oxide layer 334 can have a thickness 334t ranging from about 1 nm to about 3 nm. Based on the disclosure herein, it will be recognized that other oxide materials, formation methods, and thicknesses for protective oxide layer 334 are within the scope and spirit of this disclosure.

Protective oxide layer 334 can help protect fin structures 106 during patterning and etching of polysilicon structures 336 that can be subsequently replaced by gate structures 110 in a gate replacement process. The presence of protective oxide layer 334 allow etching polysilicon from a high aspect ratio space 342 (e.g., aspect ratio greater than 1:15, 1:18, or 1:20) between fin structures 106 without substantially etching and/or damaging fin structures 106 during the formation of the polysilicon structures 336.

In some embodiments, protective oxide layer 334 can be removed during subsequent gate replacement process when finFET 100 is used as a non-input/output (non-IO) device in core circuits (also may be referred as "logic circuits" or "memory circuits") formed in core regions (also may be referred as "logic regions" or "memory regions") of an integrated circuit (IC). In some embodiments, the non-IO device is referred as a core device, a logic device, and/or a memory device that are not configured to handle the input/output voltages/currents directly. In some embodiments, the non-IO device includes logic gates such as, for example, NAND, NOR, INVERTER, or a combination thereof. In some embodiments, the non-IO devices include a memory device such as, for example, a static random-access memory (SRAM) device.

In some embodiments, protective oxide layer 334 may not be removed and forms a part of gate dielectric layers of gate structures 110 when finFET 100 is used as an input/output (IO) device in peripheral circuits (e.g., IO circuits) formed in peripheral regions (also may be referred as "IO regions" or "high voltage regions") of an IC. The IO device can be configured to handle the input/output voltages/currents of the IC and to tolerate a greater amount of voltage or current swing than the non-IO devices.

The formation of protective oxide layer 334 can be followed by the formation of polysilicon structures 336 as shown in FIGS. 3A and 3B. In some embodiments, vertical dimensions 336t of polysilicon structures 336 can be in a range from about 90 nm to about 200 nm. In some embodiments, the gate length 336L of polysilicon structures 336 can be in a range from about 10 nm to about 30 nm (e.g., 10 nm to 30 nm). In some embodiments, gate length 336L can in a range from about 3 nm to about 10 nm (e.g., 3 nm to 10 nm). In some embodiments, gate length 336L can be less than 3 nm. In some embodiments, polysilicon structures 336 is formed by blanket deposition of polysilicon, followed by patterning and etching the deposited polysilicon. The deposition process can include CVD, PVD, ALD, other suitable deposition methods, and/or combinations thereof. A patterning process includes photoresist coating (e.g., spin-on coating), soft baking, mask aligning, exposure, post-exposure baking, developing the photoresist, rinsing, drying (e.g., hard baking), other suitable processes, and/or combinations thereof. Etching processes can include dry etching, wet etching, and/or other etching methods (e.g., reactive ion etching).

In some embodiments, etching of the deposited polysilicon to form polysilicon structures 336 can include four etching steps. In some embodiments, the first polysilicon etch step can include using a gas mixture having hydrogen bromide (HBr), oxygen ($O_2$), fluoroform ($CHF_3$), and chlorine ($Cl_2$). In some embodiments, the second polysilicon etch step can include using a gas mixture having HBr, $O_2$, $Cl_2$, and nitrogen ($N_2$) at a pressure of about 45 mTorr to about 60 mTorr. In some embodiments, the third polysilicon etch step can include using a gas mixture having HBr, $O_2$, $Cl_2$, $N_2$, and argon (Ar) at a pressure of about 45 mTorr to about 60 mTorr. In some embodiments, the fourth polysilicon etch step can include using a gas mixture having HBr, $O_2$, $Cl_2$, and $N_2$ at a pressure of about 45 mTorr to about 60 mTorr. In some embodiments, the first polysilicon etch step can have a higher polysilicon etch rate than the second, third, and/or fourth polysilicon etch steps. The first polysilicon etch step is used to etch portions of the blanket deposited polysilicon above fin structures 106 that are not part of polysilicon structures 336. The second, third, and fourth polysilicon etch steps are used to etch portions of the blanket deposited polysilicon within high aspect ratio space 342 that are not part of polysilicon structures 842A and 842B.

In some embodiments, polysilicon structures 336 and hard mask layers 338 and 340 can be replaced in a gate replacement process during subsequent processing to form gate structures 110 discussed above. In some embodiments, hard mask layers 338 and 340 can be patterned on polysilicon structures 336 to protect polysilicon structures 336 from subsequent processing steps. Hard mask layer 338 can include nitride material such as, for example, silicon nitride and hard mask layer 340 can include oxide material such as, for example, silicon oxide.

Figure 5B:
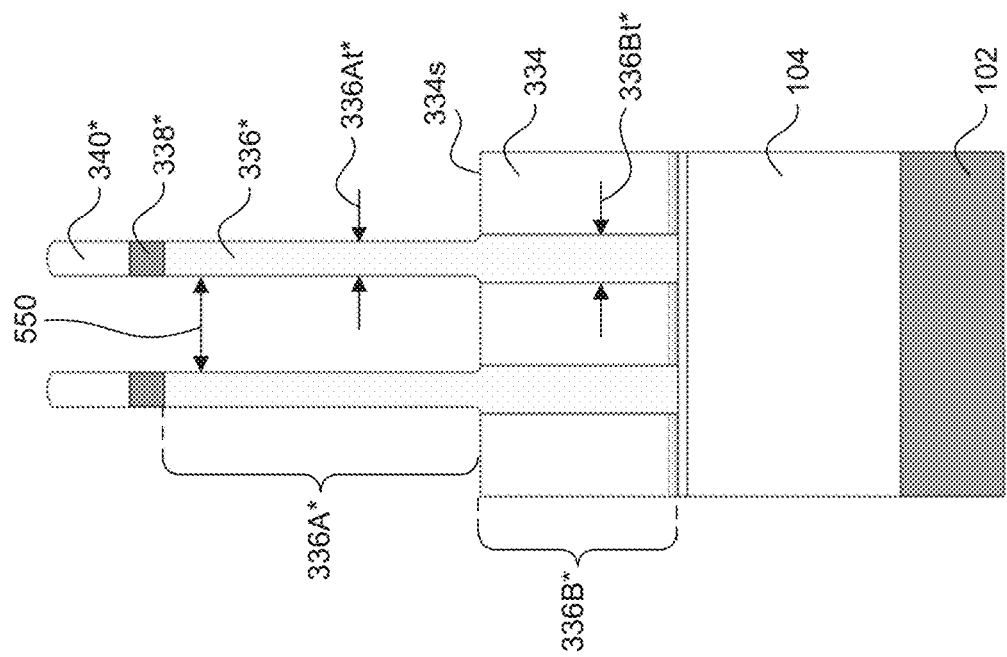
Figure 5A:
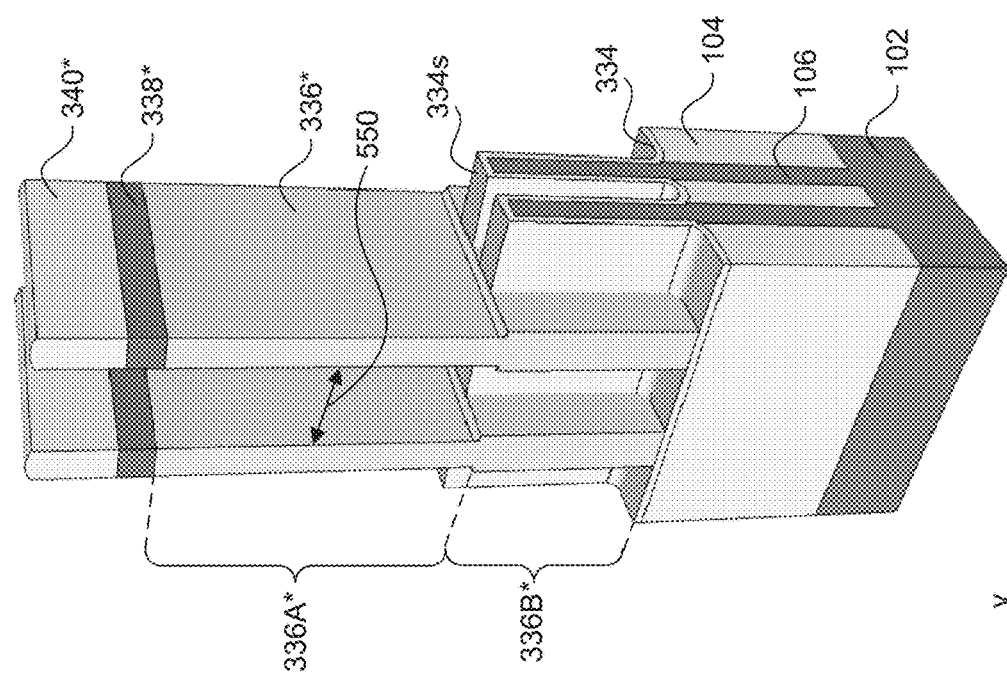

In referring to FIG. 2, in operation 210, portions of the polysilicon structures are trimmed. For example, a trimming process (described with reference to FIGS. 4A-5A and 4B-5B) is performed on polysilicon structures 336 to form trimmed polysilicon structures 336* as shown in FIGS. 5A and 5B. The trimming process can include an oxidation process and an etching process. The oxidation process can include heating the structure shown in FIGS. 3A and 3B in a highly oxidized environment at a temperature ranging from about 40° C. to 100° C. In some embodiments, the oxidation temperature can be in a range between about 60° C. and about 90° C. The oxidized environment can be an oxygen plasma environment having oxygen and nitrogen to oxidize portions of polysilicon structures 336. In some embodiments, argon can be used with oxygen in the oxidation process. In some embodiments, the oxidation pressure can be in a range between about 10 mTorr and about 1000 mTorr. In some embodiments, the oxidation process can be performed for a length of time between about 40 s to about 180 s.

In some embodiments, upper portions 336A of polysilicon structures 336 oxidize at a faster rate than lower portions 336B of polysilicon structures 336B. In some embodiments, upper portions 336A are portions of polysilicon structure 336 that extend above a top surface 334s of protective oxide layer 334. In some embodiments, upper portions 336A are portions of polysilicon structure 336 that extend above a top surface of fin structure 106, especially if protective oxide layer 334 has a thickness below a predetermined value (e.g., about 1 nm). The faster oxidation rate may be due to faster diffusion of oxygen plasma to upper portions 336A than lower portions 336B. In some embodiments, structural differences can cause plasma and gas diffusion variations in different portions of polysilicon structures 336. For example, portions of polysilicon structure 336 that extend below top surface 334s of protective oxide layer 334 is adjacent to fin structure 106 and an polysilicon structure. Therefore, these portions below top surface 334s has a surface area less accessible to the gas plasma than the portions of polysilicon structure 336 that extend above the top surface 334s which is not adjacent to fin structure 106. Upper portions 336A have oxidized polysilicon regions 444 each having a thickness 444t ranging from about 2 nm to about 4 nm. In some embodiments, a ratio of thickness 444t divided by gate length 336L can be between about 1:14 and about 1:5 (e.g., between 1:14 and 1:5). Lower portions 336B have oxidized polysilicon regions 446 each having a thickness 446t ranging from about 0.5 nm to about 2 nm. Thicknesses 444t and 446t can be different from each other. In some embodiments, portions 448 of hard mask layer 338 can be oxidized substantially simultaneously with polysilicon structures 336 during the oxidation process. Portions 448 may have a thickness 448t ranging from about 2 nm to about 4 nm. In some embodiments, thicknesses 444t and 448t can be substantially equal to each other.

The oxidation process may be followed by the etching process to remove oxidized regions 444, 446, and 448 substantially simultaneously and form trimmed polysilicon structures 336*, trimmed hard mask layers 338* and 340* as shown in FIGS. 5A and 5B. The etching process can include a wet etch process, a dry etch process, and/or combinations thereof. In some embodiments, the wet etch process can include treating the structure shown in FIGS. 4A and 4B with diluted solution of hydrofluoric acid (HF) and/or performing an etch process on the structure shown in FIGS. 4A and 4B. The etching process can provide high etch selectivity between different materials. For example, the etching process can etch silicon oxide material at a significantly higher etch rate than silicon material such that the oxidized material can be removed without damaging the underlying silicon material.

The etch process may use ammonia ($NH_3$) and hydrofluoric acid (HF) as etchants and inert gases such as, for example, Ar, xenon (Xe), He, or a combination thereof. In some embodiments, the flow rate of HF and $NH_3$ used in the etch process may each range from about 10 sccm to about 100 sccm (e.g., about 20 sccm, 30 sccm, or 40 sccm). In some embodiments, the etch process may be performed at a pressure ranging from about 5 mTorr to about 100 mTorr (e.g., about 20 mTorr, about 30 mTorr, or about 40 mTorr) and a temperature ranging from about 35° C. to about 75° C.

In some embodiments, the dry etch process can include performing an etch process on the structure shown in FIGS. 4A and 4B. The etch process can include a remote plasma assisted dry etch process at a temperature ranging from about 35° C. to about 85° C. The remote plasma assisted dry etch process includes an exposure of the structure shown in FIGS. 4A and 4B to a gas mixture having nitrogen trifluoride ($NF_3$) and ammonia ($NH_3$). The gas mixture flows together through a remote plasma system (RPS) and into a reaction region. In some embodiments, an $NH_3$ flow rate may be twice that of a $NF_3$ flow rate, which translates to a hydrogen-to-fluorine atomic flow ratio of about 2:1. In some embodiments, hydrogen-to-fluorine atomic flow ratio can be less than 1:1, less than 1:2, less than 1:4, greater than 5:1, greater than 10:1 or greater than 20:1.

Each of trimmed polysilicon structures 336* has first and second portions 336A* and 336B*. As shown in FIGS. 5A and 5B, portions 336A* are portions of trimmed polysilicon structures 336* that extend above top surface 334s of protective oxide layer 334 and portions 336B* are portions of trimmed polysilicon structures 336* that are below the top surface 334s of protective oxide layer 334. Portions 336A* and 336B* have respective first and second horizontal dimensions (e.g., lengths) along X-axis 336At* and 336Bt* (shown in FIG. 5B). In some embodiments, 336Bt* may be greater than 336At* by a value ranging from about 1 nm to about 4 nm. In some embodiments, 336At* may range from about 8 nm to about 12 nm and 336Bt* may range from about 9 nm to about 16 nm. In some embodiments, the length ratio of 336At* divided by 336Bt* can be between about 1:1.2 to about 1:1.1 (e.g., between 1:1.2 to 1:1.1). In some embodiments, the length ratio can be less than 1:1.2 or greater than 1:1.1. In some embodiments, first horizontal dimensions 336At* can vary across first portion 336A* along the Z-axis. For example, first horizontal dimensions 336At* measured at substantially top, middle, and bottom locations (along the Z-axis) of first portion 336A* can be different. In some embodiments, first horizontal dimensions 336At* measured at a substantially middle location of first portion 336A* can be greater than width measurements taken at a substantially top or bottom location. In some embodiments, first horizontal dimensions 336At* measured at substantially top, middle, and bottom locations (along the Z-axis) of first portion 336A* are about the same.

The varying widths of each trimmed polysilicon structures 336* along Z-axis can help to enlarge a window 550 for forming S/D contact structures 128 on S/D regions 108 (described with reference to FIGS. 1A and 1B) and minimize short channel effects in finFET 100. First portions 336A* with thickness 336At* can substantially equal to gate lengths $Lg_1$ of gate structures 110 that can be subsequently formed by replacing trimmed polysilicon structures 336* in a gate replacement process. Whereas, second portions 336B* with thickness 336Bt* can substantially equal to gate lengths $Lg_2$ of gate structures 110. Thicknesses 336At* and 336Bt* can be substantially equal to respective gate lengths $Lg_t$ and $Lg_2$ of gate structures 110 after trimmed polysilicon structures 336* are replaced by gate structures 110. In some embodiments, first portions 336A* can have thickness 336At* less than 12 nm (e.g., in a range from about 5 nm to about 11 nm) to enlarge the window for S/D contact structures 128 between gate structures 110 and between gate structures 110 and adjacent elements (not shown). Second portions 336B* can have thickness 336Bt* greater than, for example, 12 nm (e.g., in a range from about 13 nm to about 30 nm to minimize short channel effects in finFET 100.

Figure 6A:
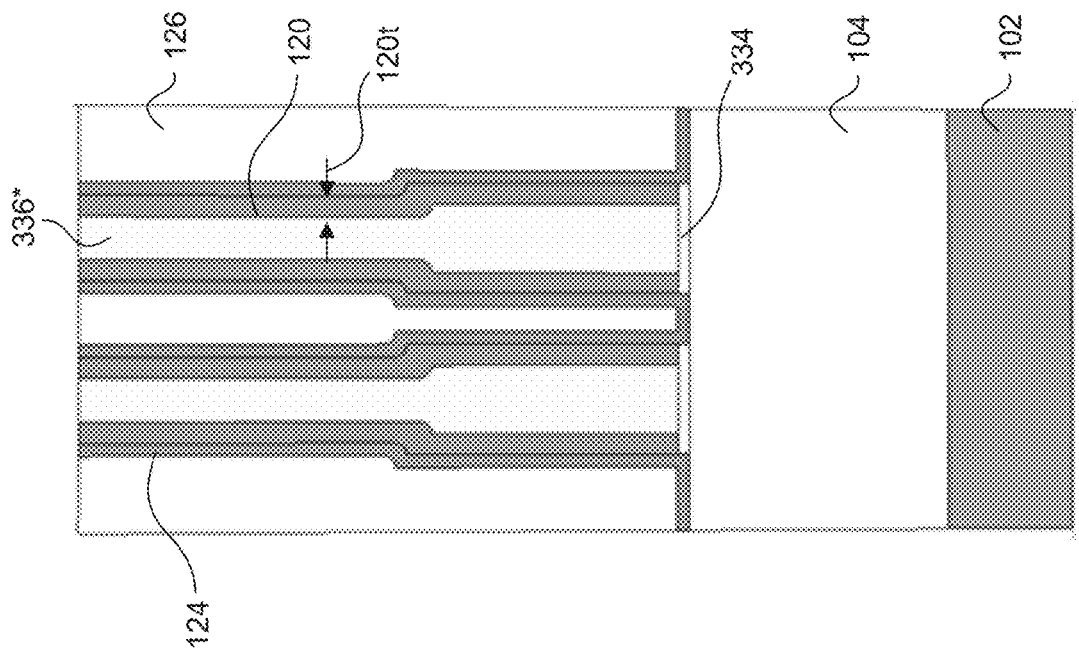
Figure 6B:
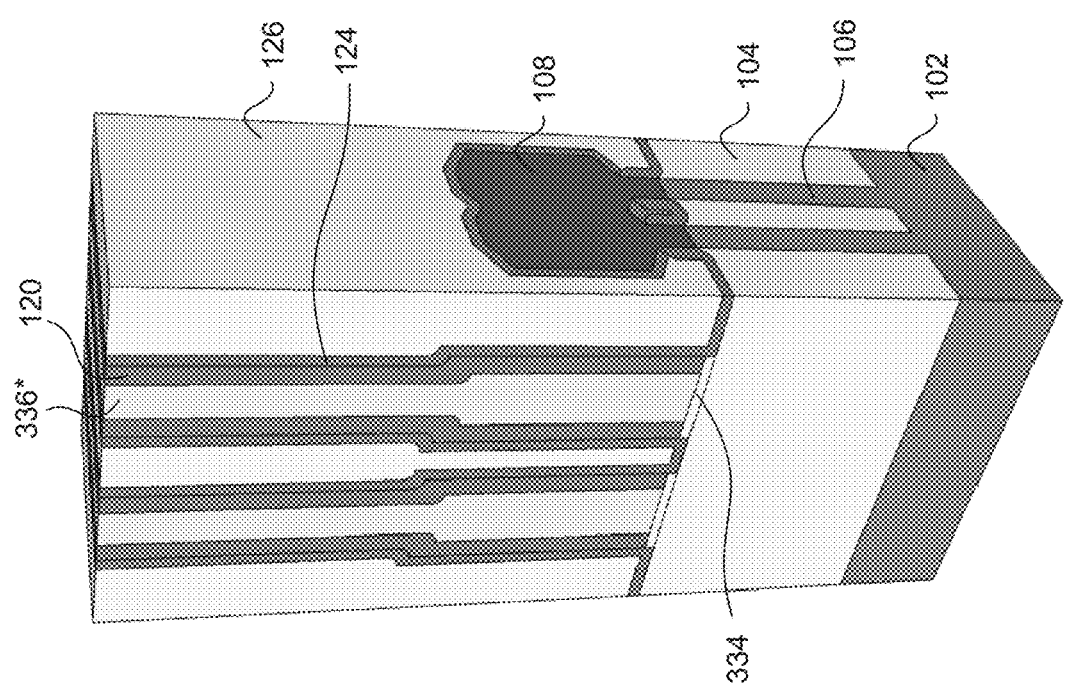

In referring to FIG. 2, in operation 215, spacers are formed on sidewalls of the trimmed polysilicon structures and epitaxial S/D regions are formed. For example, as shown in FIGS. 6A and 6B, spacers 120 may be formed on sidewalls of trimmed polysilicon structures 336* and epitaxial S/D regions 108 may be formed on recessed portions of fin structures 106.

The formation of spacers 120 includes blanket deposition of an insulating material (e.g., an oxide or a nitride material) on the structures as shown in FIGS. 5A and 5B by a CVD, a PVD, or an ALD process followed by a patterning process, an etching process (e.g., reactive ion etching or other dry etching process using a chlorine or fluorine based etchant), and other suitable processes. Spacer 120 can each have a thickness 120t in a range from about 5 nm to about 15 nm, according to some embodiments.

The formation of spacers 120 can be followed by etch back of portions of fin structures 106 that are not covered by trimmed polysilicon structures 336* and spacers 120. In some embodiments, a biased etching process can be performed to etch back these portions of fin structures 106. The etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the etching process, trimmed polysilicon structures 336* are protected from being etched by trimmed hard mask layers 338* and 340*.

The etch back process can be followed by the epitaxial growth of S/D regions 108 on the recessed portions of fin structures 106. In some embodiments, S/D regions 108 may be grown by (i) chemical vapor deposition (CVD) such as, for example, by LPCVD, atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, of S/D regions 108A and 108B can be grown by an epitaxial deposition/partial etch process, which repeats the epitaxial deposition/partial etch process at least once. As discussed above, such repeated deposition/partial etch process is a CDE process. In some embodiments, of S/D regions 108A and 108B can be grown by selective epitaxial growth (SEG), where an etching gas is added to promote the selective growth of semiconductor material on the recessed portions of fin structures 106, but not on insulating material (e.g., dielectric material of STI regions 104A and 104B).

In some embodiments, S/D regions 108 can be p-type or n-type. In some embodiments, p-type of S/D regions 108 can include SiGe and can be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type of S/D regions 108 can include Si and can be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used.

In some embodiments, the formation of S/D regions 108 can be followed by the formation of ESL 124 and ILD layer 126 as shown in FIGS. 6A and 6B. In some embodiments, ESL 124 can include, for example, SiNx, SiON, SiC, SiCN, BN, SiBN, SiCBN, and/or combinations thereof. In some embodiments, ESL 124 includes silicon nitride formed by LPCVD, PECVD, CVD, or ALD. In some embodiments, ILD layer 126 includes a dielectric material. The dielectric material of ILD layer 126 can be deposited using a deposition method suitable for flowable dielectric materials (e.g., flowable silicon oxide). For example, flowable silicon oxide can be deposited for ILD layer 126 using flowable CVD (FCVD).

Figure 7B:
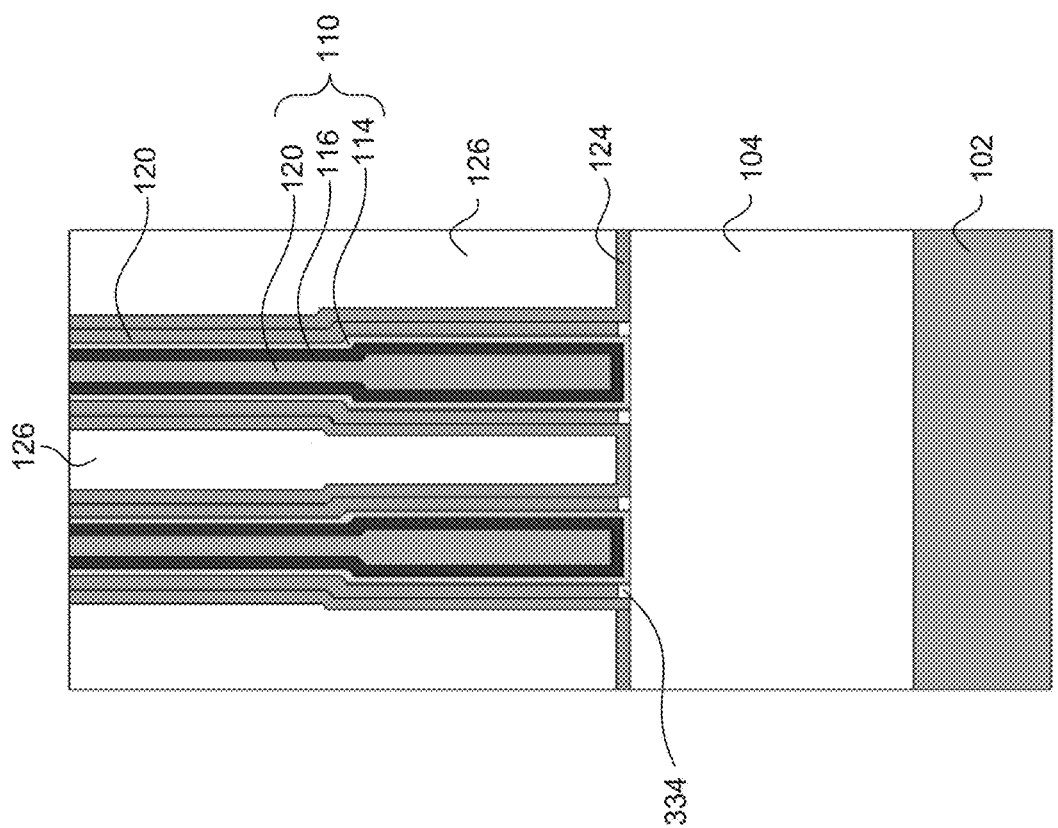
Figure 7A:
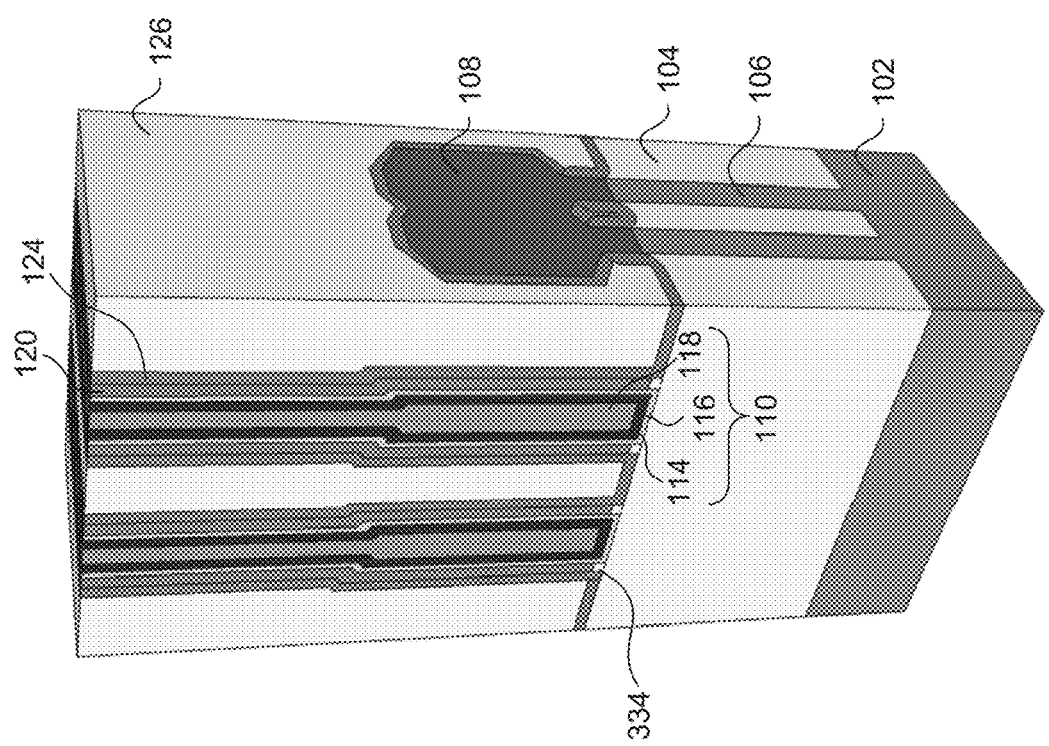

In referring to FIG. 2, in operation 220, the trimmed polysilicon structures are replaced with a gate structure. For example, as shown in FIGS. 7A and 7B, gate structures 110 can be formed after removing trimmed polysilicon structures 336*. The removal of trimmed polysilicon structures 336* can be performed using a dry etching process (e.g., reaction ion etching) or a wet etching process. In some embodiments, the gas etchants used in etching of trimmed polysilicon structures 336* can include chlorine, fluorine, or bromine. In some embodiments, an NH$_4$OH wet etch is used to remove trimmed polysilicon structures 336*, or a dry etch followed by a wet etch process can be used to remove trimmed polysilicon structures 336*.

The removal of trimmed polysilicon structures 336* can be followed by removal of the exposed portions of protective oxide layer 334 that were under polysilicon structures 336*. The removal process can be performed using a dry etching process (e.g., reaction ion etching), a wet etching process (e.g., using diluted HF), and/or combinations thereof. In some embodiments, the gas etchants used in the dry etching process can include chlorine, fluorine, bromine, and/or combinations thereof.

The removal of the exposed portions of protective oxide layer 334 can be followed by formation of gate structures 110, which includes formation of oxide layer 114 followed by deposition of dielectric layer 116 and gate electrode 118. Oxide layer 114 can be formed during a wet clean process after the removal of the protective oxide layer 334. In some embodiments, oxide layer 114 can have a thickness ranging from about 0.5 nm to about 2 nm.

Dielectric layer 116 can include silicon oxide that is formed by CVD, ALD, PVD, e-beam evaporation, other suitable process, and/or combinations thereof. In some embodiments, dielectric layer 116 can include (i) a layer of silicon oxide, silicon nitride, and/or silicon oxynitride, (ii) a high-k dielectric material such as, for example, hafnium oxide (HfO$_2$), TiO$_2$, HfZrO, Ta$_2$O$_3$, HfSiO$_4$, ZrO$_2$, ZrSiO$_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) combinations thereof. High-k dielectric layers can be formed by ALD, other suitable methods, and/or combinations thereof. In some embodiments, dielectric layer 116 can include a single layer or a stack of insulating material layers.

The deposition of dielectric layer 116 can be followed by deposition of gate electrode 118. Gate electrode 118 can include a single metal layer or a stack of metal layers. The stack of metal layers can include metals different from each other. In some embodiments, gate electrode 118 can include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate electrode 118 can be formed by ALD, PVD, CVD, or other suitable deposition process.

The deposited oxide layer 114, dielectric layer 116, and gate electrode 118 can be planarized by a CMP process. The CMP process coplanarizes top surfaces of oxide layer 114, dielectric layer 116, and gate electrode 118 with top surface ILD layer 126 as shown in FIGS. 7A and 7B.

Figure 8B:
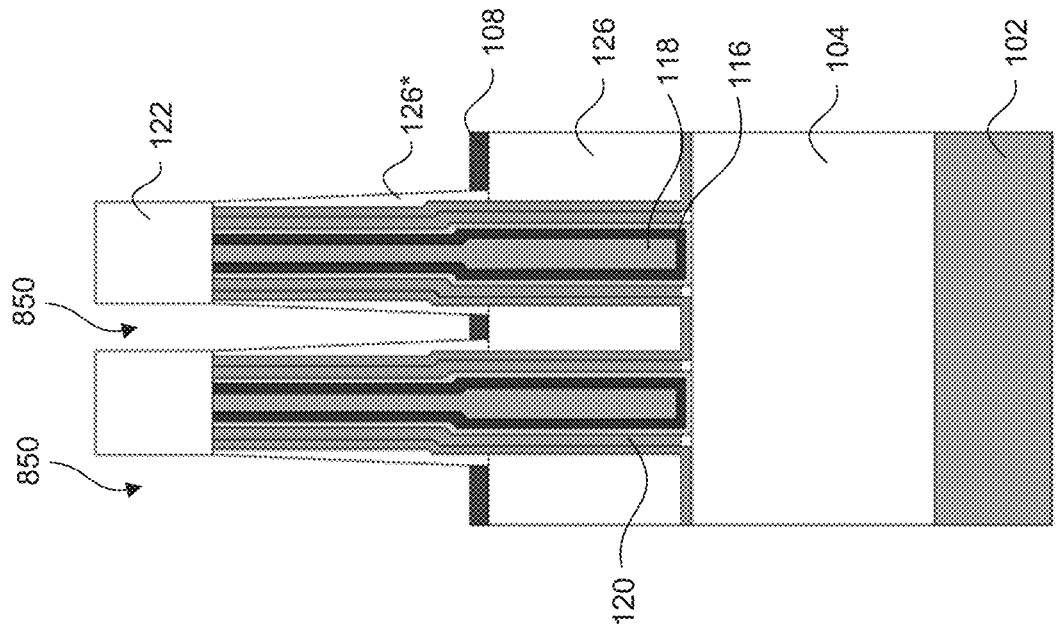
Figure 8A:
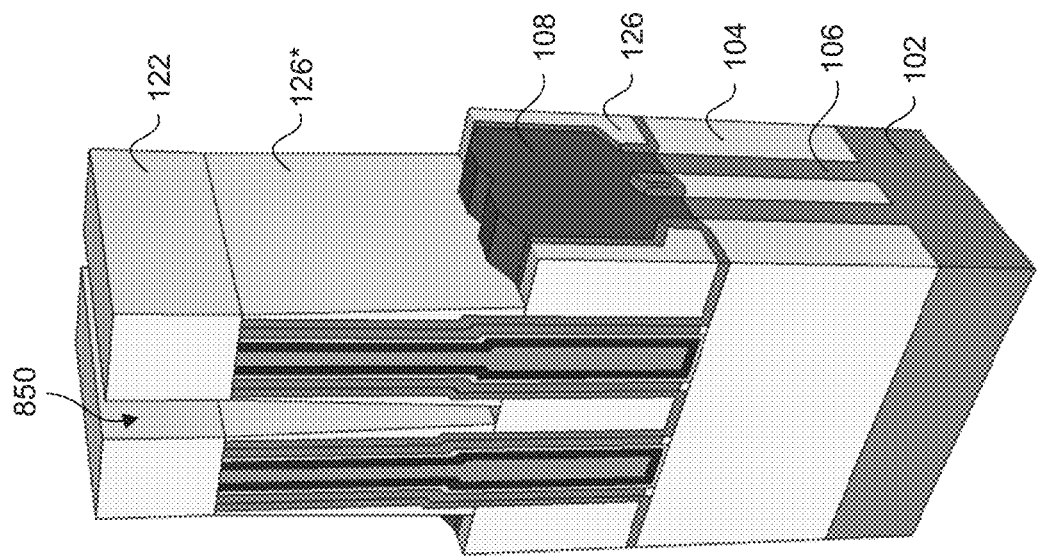

In referring to FIG. 2, in operation 225, gate capping structures and S/D contact openings are formed. For example, as shown in FIGS. 8A and 8B, gate capping structures 122 are formed on gate structures 110 and S/D contact openings 850 are formed on epitaxial regions 108. In some embodiments, formation of gate capping structures 122 includes deposition of the material of gate capping layers 122 on the structure shown in FIGS. 7A and 7B using, for example, CVD, ALD, other suitable deposition process, and/or combinations thereof. Gate capping structures 122 can each include one or more layers of insulating material having (i) nitride-based material such as, for example, silicon nitride, silicon-rich nitride, silicon oxynitride, titanium nitride; (ii) carbide-based material such as, for example, silicon carbide, titanium carbide, tungsten carbide, other suitable metal carbides; (iii) an elementary semiconductor such as, for example, silicon; (iv) metal oxide-based material; or (v) combinations thereof. In some embodiments, gate capping structures 122 each include a stack of layers of insulating material, where each layer of the stack can have a material and dimensions different from each other layers in the stack. The stack of layers can include two or more layers of the insulating material. In some embodiments, each of gate capping structures 122 has a thickness 122$t$ that may range from about 10 nm to about 70 nm.

The formation of gate capping structures 122 is followed by the formation of S/D contact openings 850. The formation of S/D contact openings 850 can include (i) removing portions of ILD layer 126 overlying epitaxial S/D regions 108 to form etched ILD layer 126* and (ii) removing portions of ESL 124 underlying the etched portions of ILD layer 126. The removal of the portions of ILD layer 126 can include patterning using photolithography to expose areas on top surface of ILD layer 126 corresponding to the portions of ILD layer 126 that are to be removed. The portions of ILD layer 126 can be removed by a dry etching process. In some embodiments, the dry etching process is a fluorine-based plasma etching process.

The ILD etch process can include two steps. In the first etch step, etching can be performed using CF$_4$ gas at a flow rate ranging from about 50 sccm to about 500 sccm. In the second etch step, etching can be performed using a gas mixture including C$_4$F$_6$ gas at a flow rate ranging from about 5 sccm to about 50 sccm, Ar gas at a flow rate ranging from about 100 sccm to about 500 sccm, and O$_2$ gas at a flow rate ranging from about 5 sccm to about 50 sccm. In some embodiments, each of the first and second etch steps can be carried out for a time period ranging from about 1 sec to about 60 sec. In some embodiments, each of the first and second etch steps can be performed at a temperature ranging from about 10° C. to about 100° C., under a pressure ranging from about 3 mTorr to about 500 mTorr, and at an RF power ranging from about 300 W to about 800 W. In some embodiments, the first etch step has a higher etch rate than the second etch step.

The etching of the portions of ILD layer 126 can be followed by a dry etch process performed on portions of ESL 124 underlying the etched portions of ILD layer 126. In some embodiments, these portions of ESL 124 can be etched in two steps. In the first etch step, etching can be performed using a gas mixture including difluoromethane (CH$_2$F$_2$) gas at a flow rate ranging from about 5 sccm to about 50 sccm and carbon tetrafluoride (CF$_4$) gas at a flow rate ranging from about 10 sccm to about 100 sccm. In the second etch step, etching can be performed using a gas mixture including fluoromethane (CH$_3$F) gas at a flow rate ranging from about 5 sccm to about 50 sccm, Ar gas at a flow rate ranging from about 100 sccm to about 500 sccm, and H$_2$ gas at a flow rate ranging from about 100 sccm to about 500 sccm. In some embodiments, each of the first and second etch steps can be carried out for a time period ranging from about 1 sec to about 60 sec. In some embodiments, each of the first and second etch steps can be performed at a temperature ranging from about 10° C. to about 100° C., under a pressure ranging from about 10 mTorr to about 100 mTorr, and at an RF power ranging from about 500 W to about 800 W. In some embodiments, the first etch step has a higher etch rate than the second etch step.

Figure 9B:
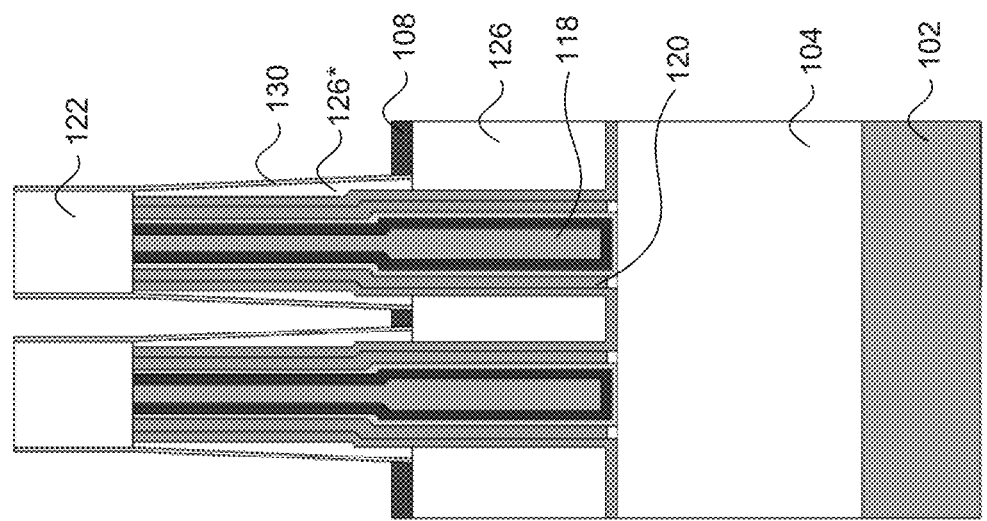
Figure 9A:
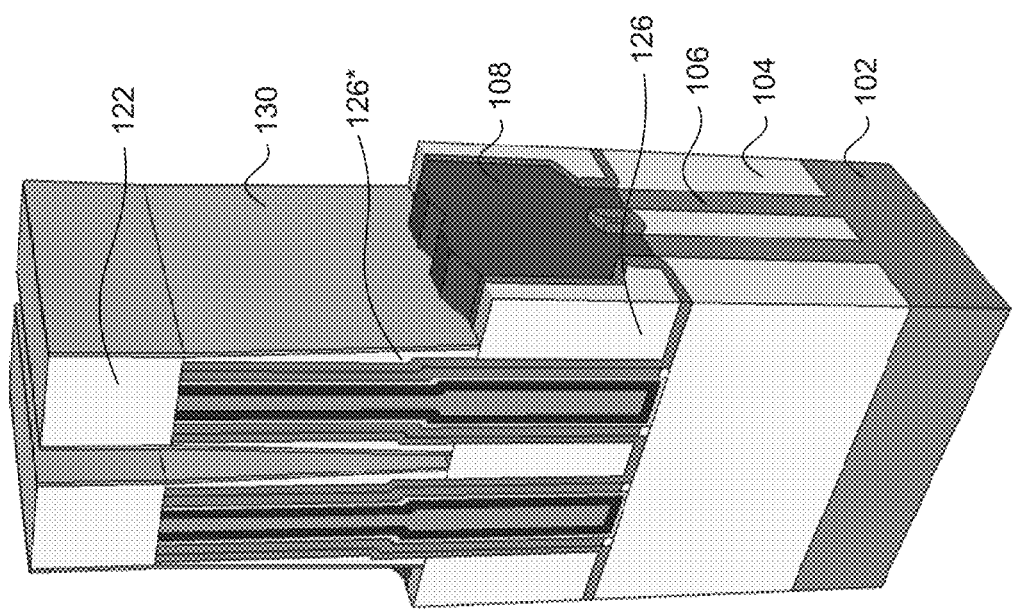

In referring to FIG. 2, in operation 230, S/D contact structures are formed in the S/D contact openings. For example, S/D contact structures 128 are formed in S/D contact openings 850 as shown in FIGS. 1A and 1B. The formation of S/D contact structures 128 includes formation of barrier layers 130 on sidewalls of etched ILD layer 126* to form the structure as shown in FIGS. 9A and 9B. The formation of S/D contact structures 128 can further include formation of conductive regions 132 to form the structure as shown in FIGS. 1A and 1B.

Barrier layer 130 can include nitride or oxide materials and provide additional barrier against electrical shorting of S/D contact structures 128 with gate structures 110. The formation of barrier layer 130 can include performing deposition and etch in a cyclic manner. In some embodiments, the etch and deposition cycle may be repeated N number of times, where N is an integer in a range of 1 to 10. The deposition process may include deposition of oxide or nitride layer on the sidewalls of etched ILD layer 126*, ILD layer 126, and on S/D regions 108. The etch process can a dry etch process performed using an etching gas mixture having nitrogen trifluoride ($NF_3$), hydrogen bromide (HBr), methane ($CH_4$), and argon (Ar). The etch process can remove the deposited oxide or nitride layer from ILD layer 126 and S/D regions 108 without substantially removing the deposited oxide or nitride layer from the sidewalls of etched ILD layer 126*.

The formation of conductive regions 132 can include deposition of materials of conductive regions 132 on the structure as shown in FIGS. 9A and 9B. Blanket deposition of the materials of conductive regions 132 can be performed using, for example, PVD, CVD, ALD, other suitable process, and/or combinations thereof. In some embodiments, conductive regions 132 includes a conductive material such as, for example, W, Al, Co, Cu, other suitable conductive material, and/or combinations thereof.

The deposition of the materials of conductive regions 132 can be followed by a CMP process to coplanarize top surfaces of conductive regions 132 with top surface of gate capping structures 122. In some embodiments, the CMP process can use a silicon or an aluminum abrasive with abrasive concentrations ranging from about 0.1% to about 3%. In some embodiments, the silicon or aluminum abrasive can have a pH level less than 7 for W metal in conductive regions 132 or a pH level greater than 7 for cobalt (Co) or copper (Cu) metals in conductive regions 132.

The above embodiments describe structures and methods for enlarging contact openings (e.g., S/D contact openings 850) for forming contact structures (e.g., S/D contact structures 128) of finFETs (e.g., finFET 100) and minimizing short channel effects of the finFETs. Such embodiments provide gate structures (e.g., gate structures 110) having varying gate lengths (e.g., gate lengths $Lg_1$ and $Lg_2$) along a vertical axis (e.g., Z-axis). Portions (e.g., portions 110A) of the gate structures that are above top surfaces of S/D regions (e.g., S/D regions 108) may have a gate length (e.g., gate length $Lg_1$) as needed to enlarge the contact openings for the formation of the contact structures without damaging the gate structures and/or shorting the contact structures with the gate structures. Other portions (e.g., portions 110B) of the gate structures that are below top surfaces of the S/D regions can be formed with another gate length (e.g., gate length $Lg_2$) as needed to minimize short channel effects, and consequently, improve the performance of the finFETs. For example, gate portions 110A can be formed with gate length $Lg_1$ less than gate length $Lg_2$ to enlarge the contact openings for the contact structures between gate structures 110 and between gate structures 110 and adjacent elements (not shown). And, gate portions 110B can be formed with gate length $Lg_2$ greater than 12 nm (e.g., 14 nm, 16 nm, 18 nm, or 20 nm) to minimize short channel effects of the finFETs.

In some embodiments, a method of forming a fin field effect transistors (finFET) on a substrate includes forming a fin structure on the substrate and forming a protective layer on the fin structure. The protective layer includes a top surface above the fin structure. The method further includes forming a polysilicon structure on the protective layer and modifying the polysilicon structure such that a first horizontal dimension of a first portion of the modified polysilicon structure is smaller than a second horizontal dimension of a second portion of the modified polysilicon structure. The first portion of the modified polysilicon structure extends above the top surface while the second portion extends below the top surface. The method further includes replacing the modified polysilicon structure with a gate structure having a first horizontal dimension of a first portion of the gate structure that is smaller than a second horizontal dimension of a second portion of the gate structure. The first portion of the gate structure extends above the top surface while the second portion of the gate structure extends below the top surface.

In some embodiments, a method of forming a fin field effect transistors (finFET) on a substrate includes forming a fin structure on the substrate, forming an oxide layer on the fin structure, and forming a polysilicon structure on the oxide layer. The method further includes modifying the polysilicon structure such that a first horizontal dimension of a first portion of the modified polysilicon structure is smaller than a second horizontal dimension of a second portion of the modified polysilicon structure. The method further includes replacing the modified polysilicon structure with a gate structure.

In some embodiments, a fin field effect transistor (finFET) on a substrate includes a fin structure on the substrate, an epitaxial source/drain region on the fin structure, and a gate structure having first and second portions. A first horizontal dimension of the first portion is smaller than a second horizontal dimension of the second portion. The first portion is above a top surface of the fin structure and the second portion is below the top surface of the fin structure. The finFET further includes a source/drain contact structure, on the epitaxial source/drain region, having a barrier layer configured to prevent electrical shorting between the source/drain contact structure and the gate structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a fin field effect transistor (finFET) on a substrate, the method comprising:
    forming a fin structure on the substrate;
    forming a protective layer on the fin structure, wherein the protective layer comprises a top surface above the fin structure;
    forming a polysilicon structure on the protective layer, wherein the polysilicon structure comprises upper and lower portions having respective first and second horizontal dimensions that are substantially the same, wherein the upper portion extends above the top surface and the lower portion extends below the top surface;

modifying the polysilicon structure such that the first horizontal dimension of the upper portion is smaller than the second horizontal dimension of the lower portion; and replacing the modified polysilicon structure with a gate structure having a first horizontal dimension of an upper portion of the gate structure that is smaller than a second horizontal dimension of lower portion of the gate structure, wherein the upper portion of the gate structure extends above the top surface and the lower portion of the gate structure extends below the top surface.

2. The method of claim 1, wherein the modifying the polysilicon structure comprises:

removing a portion of the upper portion of the polysilicon structure, the removed portion of the upper portion of the polysilicon structure having a third horizontal dimension; and removing a portion of the lower portion of the polysilicon structure, the removed portion of the lower portion of the polysilicon structure having a fourth horizontal dimension that is smaller than the third horizontal dimension.

3. The method of claim 1, wherein the modifying the polysilicon structure comprises:

oxidizing a portion of the upper portion of the polysilicon structure, the oxidized portion of the upper portion of the polysilicon structure having a third horizontal dimension; and oxidizing a portion of the lower portion of the polysilicon structure, the oxidized portion of the lower portion of the polysilicon structure having a fourth horizontal dimension that is smaller than the third horizontal dimension.

4. The method of claim 1, wherein the modifying the polysilicon structure comprises:

etching the upper portion of the polysilicon structure, the etched upper portion of the polysilicon structure having a third horizontal dimension; and etching the lower portion of the polysilicon structure, the etched lower portion of the polysilicon structure having a fourth horizontal dimension that is smaller than the third horizontal dimension.

5. The method of claim 4, wherein the third horizontal dimension ranges from about 2 nm to about 4 nm, and wherein the fourth horizontal dimension ranges from about 0.5 nm to about 2 urn.

6. The method of claim 1, further comprising:
forming spacers on the modified polysilicon structure; and
forming gate capping structures on the modified polysilicon structure and the spacers.

7. The method of claim 1, further comprising:
forming spacers on the modified polysilicon structure;
forming an etch stop layer on the spacers; and
forming gate capping structures on the modified polysilicon structure, the spacers, and the etch stop layer.

8. The method of claim 1, wherein the replacing the modified polysilicon structure with the gate structure comprises:

removing the modified polysilicon structure;
etching portions of the protective layer exposed by the removing the polysilicon structure; and
forming the gate structure on the portions of the protective layer such that the first horizontal dimension of the upper portion of the gate structure is smaller than the second horizontal dimension of the lower portion of the gate structure.

9. The method of claim 1, wherein the forming the polysilicon structure comprises:

depositing a polysilicon layer on the protective layer; and
etching first and second portions of the polysilicon layer at first and second etch rates, respectively, the first etch rate being greater than the second etch rate.

10. A method of forming a fin field effect transistor (finFET) on a substrate, the method comprising:

forming a fin structure on the substrate, wherein the fin structure extends in a horizontal direction and comprises a top surface;

forming an oxide layer on the fin structure;

forming a polysilicon structure on the oxide layer, wherein the polysilicon structure comprises an upper portion above the top surface and a lower portion below the top surface;

modifying the polysilicon structure such that a first horizontal dimension of the upper portion is smaller than a second horizontal dimension of the lower portion, wherein the first and second horizontal dimensions extend along the horizontal direction; and replacing the modified polysilicon structure with a gate structure.

11. The method of claim 10, further comprising:
forming a hard mask layer on the polysilicon structure; and
modifying the hard mask layer substantially simultaneously with the modifying the polysilicon structure.

12. The method of claim 10, wherein the modifying the polysilicon structure comprises:

etching the upper portion of the polysilicon structure, the etched upper portion having a third horizontal dimension; and etching the lower portion of the poly silicon structure, the lower portion having a fourth thickness that is smaller than the third horizontal dimension.

13. The method of claim 10, wherein the modifying the polysilicon structure comprises performing an oxidization process on the polysilicon structure, the oxidization process comprising:

oxidizing the upper portion of the polysilicon structure at a first oxidation rate; and oxidizing the lower portion of the polysilicon structure at a second oxidation rate that is slower than the first oxidation rate.

14. The method of claim 10, wherein the replacing the modified polysilicon structure with the gate structure comprises:

removing the modified polysilicon structure;
etching portions of the oxide layer exposed by the removing the polysilicon structure; and
forming the gate structure such that a first horizontal dimension of an upper portion of the gate structure is smaller than a second horizontal dimension of lower portion of the gate structure.

15. The method of claim 10, wherein a ratio of the first horizontal dimension of the upper portion of the polysilicon structure to the second horizontal dimension of the lower portion of the polysilicon structure ranges from about 1:1.2 to about 1:1.1.

16. A method of forming a fin field effect transistor (finFET) on a substrate, the method comprising:
forming a fin structure on the substrate;

forming a polysilicon structure over the fin structure, the polysilicon structure comprising:
- an upper portion comprising a first pair of opposing sidewalls having a first horizontal separation between each sidewall of the first pair of opposing sidewalls; and
- a lower portion comprising a second pair of opposing sidewalls having a second horizontal separation between each sidewall of the second pair of opposing sidewalls, wherein the first and second horizontal separations are substantially equal;

oxidizing a first portion of the polysilicon structure through the first pair of opposing sidewalls at a first oxidation rate;

oxidizing a second portion of the polysilicon structure through the second pair of opposing sidewalk at a second oxidation rate that is slower than the first oxidation rate; and replacing the polysilicon structure with a gate structure.

17. The method of claim 16, wherein the upper portion of the polysilicon structure extends above a top surface of the fin structure and the lower portion of the polysilicon structure extends below the top surface of the fin structure.

18. The method of claim 16, further comprising removing the oxidized first and second portions of the polysilicon structure.

19. The method of claim 16, further comprising forming an oxide layer on the fin structure.

20. The method of claim 19, wherein the replacing the polysilicon structure with the gate structure comprises removing the polysilicon structure and etching portions of the oxide layer exposed by the removal of the polysilicon structure.

* * * * *